(12) United States Patent
Won

(10) Patent No.: US 8,174,916 B2
(45) Date of Patent: May 8, 2012

(54) BIT LINE PRECHARGE CIRCUIT AND A SEMICONDUCTOR MEMORY APPARATUS USING THE SAME

(75) Inventor: Hyung Sik Won, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 228 days.

(21) Appl. No.: 12/476,349

(22) Filed: Jun. 2, 2009

(65) Prior Publication Data

US 2010/0165768 A1    Jul. 1, 2010

(30) Foreign Application Priority Data

Dec. 30, 2008    (KR) .................. 10-2008-0136396

(51) Int. Cl.
    *G11C 7/00*      (2006.01)
(52) U.S. Cl. ............... 365/203; 365/189.06; 365/230.06
(58) Field of Classification Search .................. 365/203, 365/189.06, 230.06, 207, 194, 205, 201, 365/189.08, 189.11, 202, 206
See application file for complete search history.

(56) References Cited

U.S. PATENT DOCUMENTS

| | | | |
|---|---|---|---|
| 7,193,912 B2 * | 3/2007 | Obara et al. | 365/203 |
| 7,440,350 B2 | 10/2008 | Obara et al. | |
| 2006/0158943 A1 * | 7/2006 | Park et al. | 365/203 |
| 2007/0002653 A1 * | 1/2007 | Jung et al. | 365/203 |
| 2007/0183234 A1 | 8/2007 | Han et al. | |
| 2008/0285356 A1 * | 11/2008 | Byeon et al. | 365/189.06 |

FOREIGN PATENT DOCUMENTS

| | | |
|---|---|---|
| JP | 2007-018636 | 1/2007 |
| KR | 1020050000719 A | 1/2005 |

* cited by examiner

*Primary Examiner* — Dang Nguyen
(74) *Attorney, Agent, or Firm* — IP & T Group LLP

(57) ABSTRACT

A bit line precharge circuit includes a precharge signal generation unit configured to generate first and second precharge signals that are enabled at different timing points by receiving a bit line equalizing signal; a first precharge unit configured to connect a pair of bit lines to each other in response to the first precharge signal and supply a bit line precharge voltage to the pair of bit lines; and a second precharge unit configured to supply the bit line precharge voltage to the bit line in response to the second precharge signal.

7 Claims, 4 Drawing Sheets

BIT LINE PRECHARGE CIRCUIT AND A SEMICONDUCTOR MEMORY APPARATUS USING THE SAME

CROSS-REFERENCES TO RELATED PATENT APPLICATION

The present application claims priority under 35 U.S.C 119(a) to Korean Application No. 10-2008-0136396, filed on Dec. 30, 2008, in the Korean Intellectual Property Office, the disclosure which is incorporated herein by reference in its entirety as if set forth herein in full.

BACKGROUND

1. Technical Field

The embodiment described herein relates to a semiconductor memory apparatus and, more particularly, to a bit line precharge circuit that precharges a bit line and a semiconductor memory device using the same.

2. Related Art

A semiconductor memory apparatus performs an active operation and then perform a precharge operation in order to perform a subsequent active operation. In general, when a precharge command is inputted, the precharge operation is performed and a pair of bit lines BL and /BL that are amplified to a core voltage VCORE and a ground voltage VSS respectively, are sustained to a bit line precharge voltage VBLP (a half of the voltage level of the core voltage).

FIG. 1 is a diagram illustrating a schematic configuration of a conventional bit line precharge circuit. The precharge circuit 10 includes first to third NMOS transistors N1, N2, and N3. The first NMOS transistor N1 connects the bit lines BL and /BL to each other when a bit line equalizing signal 'BLEQ' is enabled. The second and third NMOS transistors N2 and N3 sustain voltage levels of the pair of bit lines BL and /BL to the level of the bit line precharge voltage VBLP when the bit line equalizing signal 'BLEQ' is enabled. The bit line equalizing signal 'BLEQ' is generated in the semiconductor memory apparatus to be enabled when the precharge command is inputted and disabled when an active command is inputted in order to precharge the pair of bit lines BL and /BL. In FIG. 1, a short fail occurs between a word line WL and a bit line BL. The short fail may occur while the semiconductor memory apparatus is highly integrated and means that an unwanted bridge occurs between the bit line BL and the word line WL. When the short fail occurs, a leakage current is generated from the bit line BL that is precharged at the level of the bit line precharge voltage VBLP to the word line WL of the level of the ground voltage VSS. The leakage current is also referred to as a bleed current. When the bleed current increases, the voltage level of the bit line BL decreases, such that a subsequent active operation cannot be performed normally.

In order to solve the above-mentioned problem, a precharge method using a bleeder transistor has been developed. FIG. 2 is a diagram illustrating a schematic configuration of a bit line precharge circuit in another conventional art. The bit line precharge circuit 20 includes fourth to sixth NMOS transistors N4 to N6 and a bleeder NMOS transistor NB. In another conventional art, a bit line precharge voltage VBLP is not applied directly to a pair of bit lines BL and /BL but the bit line precharge voltage VBLP is applied to the pair of bit lines BL and /BL through the bleeder transistor NB. That is, the bleeder transistor NB is constituted by a transistor having a comparatively long channel length to decrease a current supply amount to the pair of bit lines BL and /BL through the bleeder transistor NB. Accordingly, the leakage current generated from the bit line BL to the word line WL remarkably decreases.

However, in said another conventional art, the ability to supply the bit line precharge voltage VBLP to the pair of bit lines BL and /BL is reduced, such that a precharge characteristic is deteriorated and an operation speed of the semiconductor memory apparatus decreases.

SUMMARY

A bit line precharge circuit and a semiconductor memory apparatus using the same that can sufficiently supply a bit line precharge voltage while decreasing a leakage current due to a short fail are disclosed herein.

In one aspect, a bit line precharge circuit includes a precharge signal generation unit configured to generate first and second precharge signals that are enabled at different timing points by receiving a bit line equalizing signal; a first precharge unit configured to connect a pair of bit lines to each other in response to the first precharge signal and supply a bit line precharge voltage to the pair of bit lines; and a second precharge unit configured to apply the bit line precharge voltage to the bit line in response to the second precharge signal.

In another aspect, a semiconductor memory apparatus performs different bit line precharge operations depending on whether or not a short fail occurs between a bit line and a word line, wherein the bit line precharge operation is performed by generating first and second precharge signals in response to receiving a bit line equalizing signal when the short fail occurs and the bit line precharge operation is performed by receiving the bit line equalizing signal when the short fail does not occur.

In still another aspect, a semiconductor memory apparatus includes a first precharge unit and a second precharge unit and performs different precharge operations depending on whether or not a short fail occurs between a bit line and a word line, wherein the bit line precharge operation is performed through the first and second precharge units when the short fail occurs and the bit line precharge operation is performed through the first precharge unit when the short fail does not occur.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
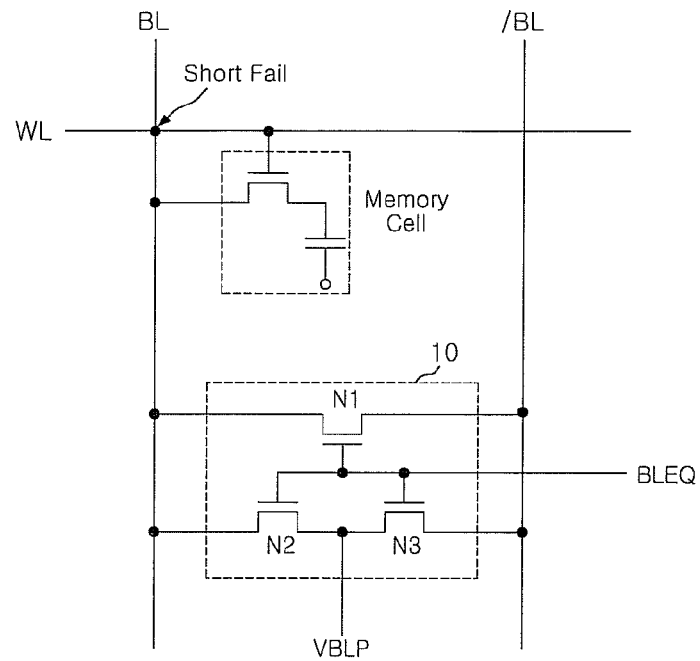
FIG. 1 is a diagram illustrating a schematic configuration of a bit line precharge circuit in the conventional art.
Figure 2:
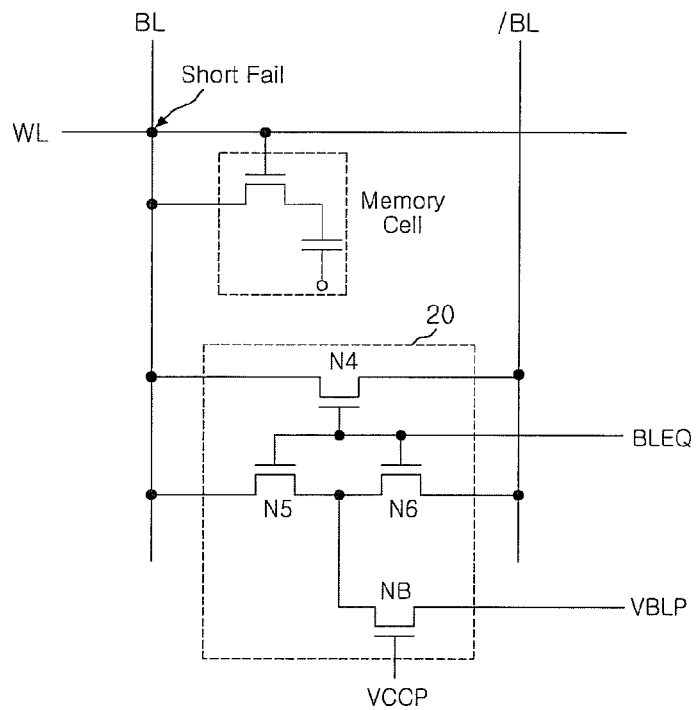
FIG. 2 is a diagram illustrating a schematic configuration of a bit line precharge circuit in another conventional art.
Figure 3:
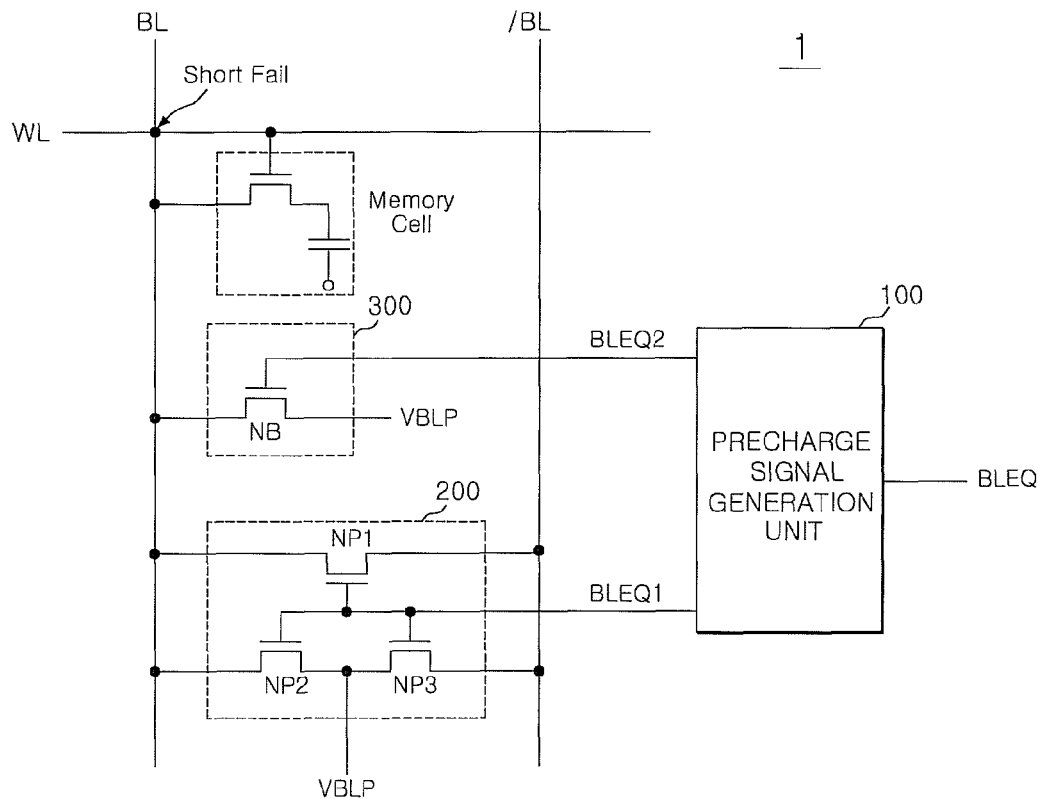
FIG. 3 is a schematic diagram of an exemplary bit line precharge circuit according to one embodiment.

FIG. 3 is a schematic diagram of an exemplary bit line precharge circuit according to one embodiment. In FIG. 3, the bit line precharge circuit 1 can include a precharge signal generation unit 100, a first precharge unit 200, and a second precharge unit 300. The precharge signal generation unit 100 can generate first and second precharge signals 'BLEQ1' and 'BLEQ2' by receiving a bit line equalizing signal 'BLEQ'. The bit line equalizing signal 'BLEQ' is enabled when a precharge command is inputted and disabled when an active command is inputted in order to precharge a bit line BL. The bit line equalizing signal 'BLEQ' may be generated in the semiconductor memory apparatus. It is preferable that the first precharge signal 'BLEQ1' generated from the precharge signal generation unit 100 is enabled when the bit line equalizing signal 'BLEQ' is enabled. It is preferable that the second precharge signal 'BLEQ2' is enabled when the first precharge signal 'BLEQ1' is disabled and disabled when the bit line equalizing signal 'BLEQ' is disabled.

The first precharge unit 200 can precharge a pair of bit lines BL and /BL in response to the first precharge signal 'BLEQ1'. The first precharge unit 200 can connect the pair of bit lines BL and /BL to each other in response to the first precharge signal 'BLEQ1' and sustain the pair of bit lines BL and /BL to the level of a bit line precharge voltage VBLR In FIG. 3, the first precharge unit 200 can include first to third NMOS transistors NP1 to NP3. The first NMOS transistor NP1 is determined to be turned ON or OFF by receiving the first precharge signal 'BLEQ1' at a gate terminal thereof to connect the pair of bit lines BL and /BL to each other. The second and third NMOS transistors NP2 and NP3 are determined to be turned ON or OFF by receiving the first precharge signal 'BLEQ1' at gate terminals thereof to supply the bit line precharge voltage VBLP to the pair of bit lines BL and /BL.

The second precharge unit 300 can supply the bit line precharge voltage VBLP to the bit line BL in response to the second precharge signal 'BLEQ2'. The second precharge unit 300 can include a bleeder NMOS transistor NB. The bleeder NMOS transistor NB is determined to be turned ON or OFF by receiving the second precharge signal 'BLEQ2' at a gate terminal thereof to supply the bit line precharge voltage VBLP to the bit line BL.

In one embodiment, it is preferable that the bleeder NMOS transistor NB constituting the second precharge unit 300 has a channel length longer than the first to third NMOS transistors NP1 to NP3 constituting the first precharge unit 200. The channel length implies the size of a transistor. In general, a transistor having a long channel means a transistor having a long length and a transistor having a short channel means a transistor having a short length. A threshold voltage of the transistor having the long channel is larger than a threshold voltage of the transistor having the short channel. Therefore, when the same gate voltage is applied, the transistor having the long channel is slower in response than the transistor having the short channel, but the transistor having the long channel performs a stable operation.

In one embodiment, the second NMOS transistor NP2 and the bleeder NMOS transistor NB receive the first and second precharge signals 'BLEQ1' and 'BLEQ2' having the same voltage level at gate terminals thereof, respectively, and receive the bit line precharge voltage VBLP at source terminals thereof. Drain terminals of the transistors are connected to the bit line BL. Accordingly, an amount of a current that flows on the bit line BL through the bleeder NMOS transistor NB having the long channel is smaller than an amount of a current that flows on the bit line BL through the second NMOS transistor NP2.

Figure 4:
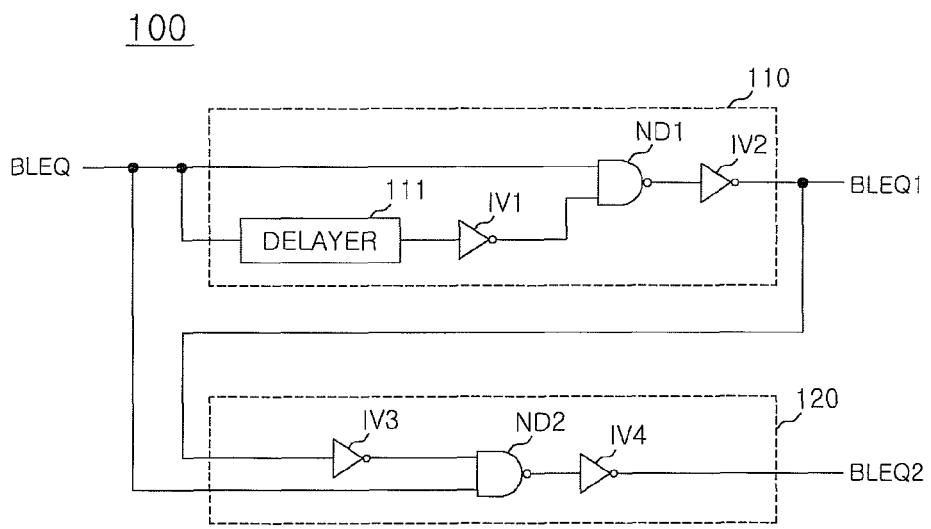
FIG. 4 is a schematic diagram of an embodiment of an exemplary precharge signal generation unit of FIG. 3.

FIG. 4 is a schematic diagram of an exemplary precharge signal generation unit of FIG. 3. In FIG. 4, the precharge signal generation unit 100 can include first and second precharge signal generation portions 110 and 120. The first precharge signal generation portion 110 can generate the first precharge signal 'BLEQ1' by receiving the bit line equalizing signal 'BLEQ' and the second precharge signal generation portion 120 can generate the second precharge signal 'BLEQ2' by receiving the bit line equalizing signal 'BLEQ' and the first precharge signal 'BLEQ1'.

The first precharge signal generation portion 110 may include a delayer 111, a first inverter IV1, a first NAND gate ND1, and a second inverter IV2. The delayer 111 may delay the bit line equalizing signal 'BLEQ' by receiving the bit line equalizing signal 'BLEQ'. A delay amount of the delayer 111 determines an enabled portion of the first precharge signal 'BLEQ1'. Accordingly, the delay amount can be controlled depending on an application of the semiconductor memory apparatus. The first inverter IV1 can invert an output of the delayer 111. The first NAND gate ND1 can receive the bit line equalizing signal 'BLEQ' and an output of the first inverter IV1. The second inverter IV2 can output the first precharge signal 'BLEQ1' by inverting an output of the first NAND gate ND1.

The second precharge signal generation portion 120 can include a third inverter IV3, a second NAND gate ND2, and a fourth inverter IV4. The third inverter IV3 can invert the first precharge signal 'BLEQ1'. The second NAND gate ND2 can receive the bit line equalizing signal 'BLEQ' and an output of the third inverter IV3. The fourth inverter IV4 can output the second precharge signal 'BLEQ2' by inverting an output of the second NAND gate ND2. Accordingly, the precharge signal generation unit 100 can enable the first precharge signal 'BLEQ1' when the bit line equalizing signal 'BLEQ' is enabled. Further, the precharge signal generation unit 100 can enable the second precharge signal 'BLEQ2' when the first precharge signal 'BLEQ1' is disabled and disable the second precharge signal 'BLEQ2' when the bit line equalizing signal 'BLEQ' is disabled.

Figure 5:
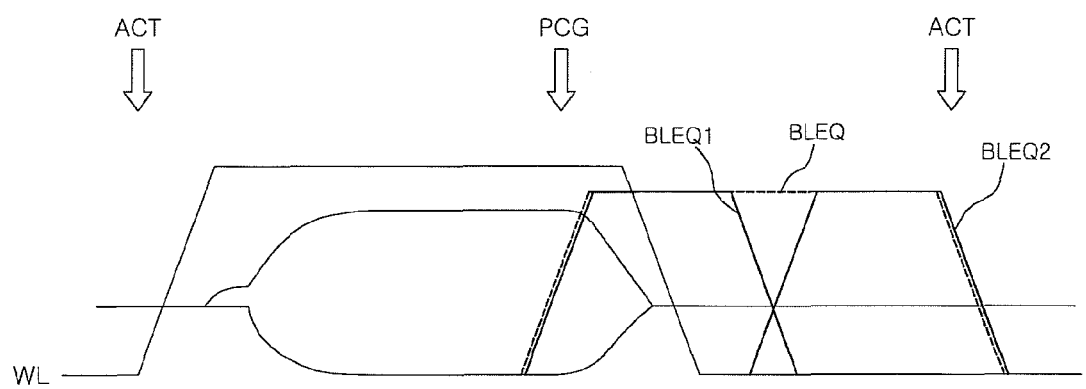
FIG. 5 is an operation timing diagram of an exemplary bit line precharge circuit according to one embodiment.

FIG. 5 is an operation timing diagram of an exemplary bit line precharge circuit according to one embodiment. Referring to FIGS. 3 to 5, an operation of the bit line precharge circuit 1 according to one embodiment will be described below. In FIG. 3, a short fail occurs between a bit line BL and a word line WL. In the semiconductor memory apparatus, when the active command 'ACT' is inputted, an active operation is performed and when the precharge command 'PCG' is inputted, the bit line equalizing signal 'BLEQ' is enabled. When the bit line equalizing signal 'BLEQ' is enabled, the first precharge signal 'BLEQ1' is enabled. The first to third NMOS transistors NP1 to NP3 constituting the first precharge unit 200 are turned ON by receiving the first precharge signal 'BLEQ1' to connect the pair of bit lines BL and /BL to each other and make voltage levels of the pair of bit lines BL and /BL to the level of the bit line precharge voltage VBLR When the precharge command 'PCG' is inputted, the word line WL drops to the level of the ground voltage 'VSS', such that a current leaks from the bit line BL to the word line WL due to the short fail. In order to solve the above-mentioned problem, the second precharge signal 'BLEQ2' is enabled while the first precharge signal 'BLEQ1' is disabled. Therefore, the first to third NMOS transistors NP1 to NP3 are turned OFF and the bleeder NMOS transistor NB is turned ON. The bleeder NMOS transistor NB can supply the bit line precharge voltage VBLP to the bit line BL. As described above, a current amount supplied by the bleeder NMOS transistor NB is smaller than a current amount supplied by the second NMOS transistor NP2. Although the current leakage from the bit line BL to the word line WL is generated due to the short fail between the bit line BL and the word line WL, a current amount applied to the bit line BL through the bleeder NMOS transistor NB is small, such that an amount of the leakage current also decreases. That is, in one embodiment, when a precharge operation is initiated, the pair of bit lines BL and /BL are made to quickly reach the level of the bit line precharge voltage VBLR Thereafter, the leakage current generated due to the short fail that occurs between the bit line BL and the word line WL can be decreased through the bleeder NMOS transistor NB. Further, it is possible to appropriately control the amount of the current that flows on the bit line BL through the bleeder NMOS transistor NB by adjusting the channel length of the bleeder NMOS transistor NB.

Figure 6:
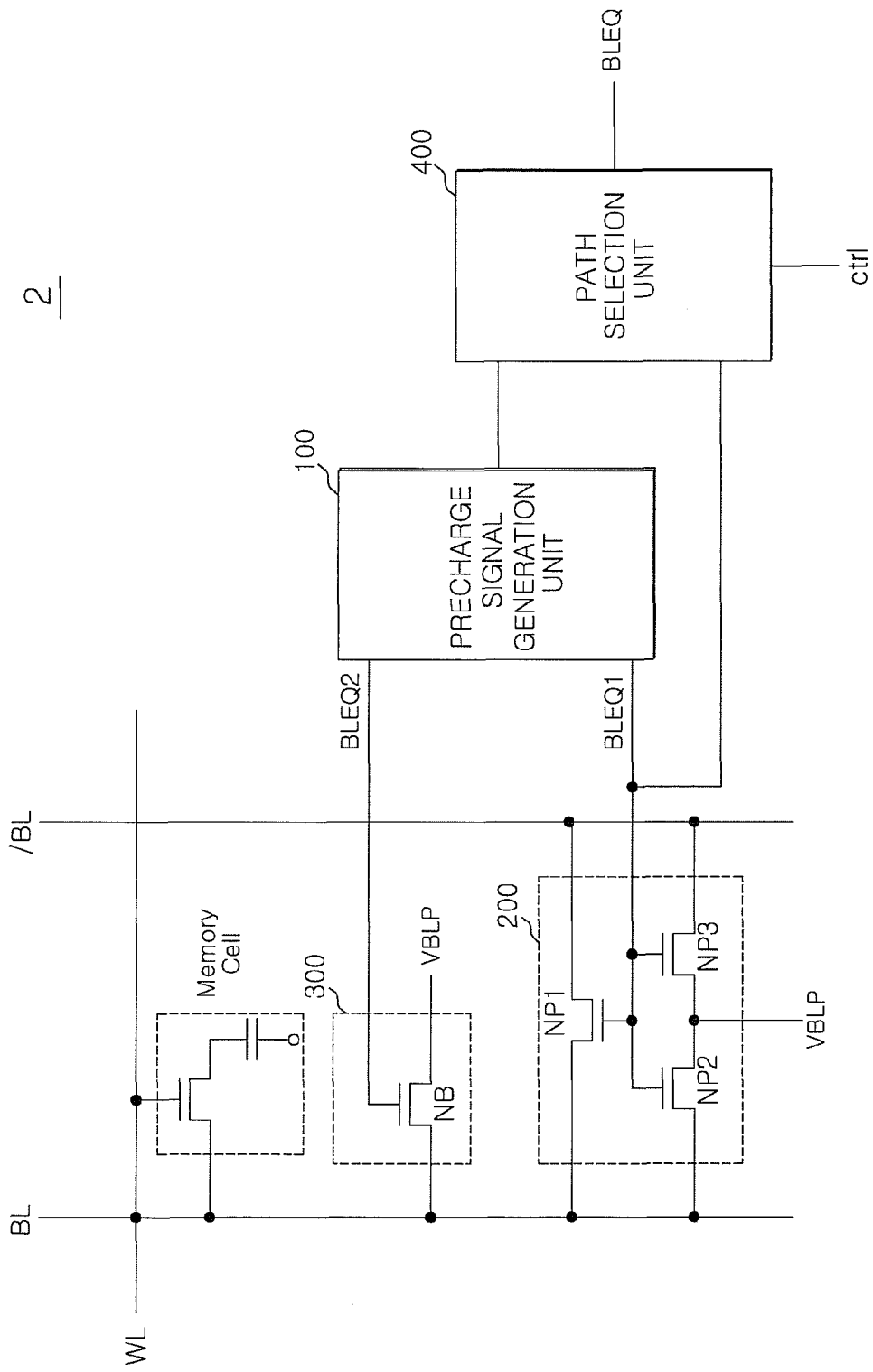
FIG. 6 is a schematic diagram of an exemplary semiconductor memory apparatus according to one embodiment.

FIG. 6 is a schematic diagram of an exemplary semiconductor memory apparatus according to one embodiment. The semiconductor memory apparatus 2 further includes a path selection unit 400 added to the bit line precharge circuit 1. The semiconductor memory apparatus 2 includes the path selection unit 400 configured to perform different precharge operations depending on whether or not the short fail occurs between the bit line BL and the word line WL. In FIG. 6, the path selection unit 400 is configured to input the bit line equalizing signal 'BLEQ' into the precharge signal generation unit 100 or input the bit line equalizing signal 'BLEQ' directly into the first precharge unit 200 by receiving a control signal 'ctrl'. The control signal 'ctrl' can have different levels depending on whether or not the short fail occurs between the bit line BL and the word line WL. For example, when the short fail occurs, the control signal 'ctrl' is at a high level, while when the short fail does not occur, the control signal 'ctrl' is at a low level. The control signal 'ctrl' can be implemented by a test mode signal or a general fuse set circuit. The path selection unit 400 can be implemented by a general multiplexer that receives the control signal 'ctrl'. The path selection unit 400 is configured to input the bit line equalizing signal 'BLEQ' into the precharge signal generation unit 100 by receiving the control signal 'ctrl' that is enabled at the high level when the short fail occurs. Therefore, when the short fail occurs, the semiconductor memory apparatus 2 performs the precharge operation in the same manner as the bit line precharge circuit 1. The path selection unit 400 is configured to input the bit line equalizing signal 'BLEQ' directly into the first precharge unit 200 by receiving the control signal 'ctrl' that is disabled to the low level when the short fail does not occur. Accordingly, since the semiconductor memory apparatus 2 performs the precharge operation through only the first precharge unit 200 that receives the bit line equalizing signal 'BLEQ' when the short fail does not occur, the semiconductor memory apparatus performs the precharge operation in the same manner as the conventional art. That is, the semiconductor memory apparatus performs the precharge operation in the same manner as in the conventional art to improve a precharge characteristic when the short fail does not occur and performs the precharge operation through the first and second precharge units 200 and 300 to reduce the leakage current generated due to the short fail while securing the precharge characteristic when the short fail occurs.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A bit line precharge circuit, comprising:
a precharge signal generation unit configured to generate first and second precharge signals that are enabled at different timing points by receiving a bit line equalizing signal;
a first precharge unit configured to connect a pair of bit lines to each other in response to the first precharge signal and supply a bit line precharge voltage to the pair of bit lines; and
a second precharge unit configured to apply the bit line precharge voltage to a bit line of the bit lines in response to the second precharge signal,
wherein an amount of a current supplied to the bit line by the second precharge unit is smaller than an amount of a current supplied to the bit line by the first precharge unit.

2. The bit line precharge circuit of claim 1, wherein the first precharge signal is enabled when the bit line equalizing signal is enabled.

3. The bit line precharge circuit of claim 2, wherein the second precharge signal is enabled when the first precharge signal is disabled and disabled when the bit line equalizing signal is disabled.

4. The bit line precharge circuit of claim 1, wherein the precharge signal generation unit includes:
a first precharge signal generation portion configured to generate the first precharge signal by receiving the bit line equalizing signal; and
a second precharge signal generation portion configured to generate the second precharge signal by receiving the bit line equalizing signal and the first precharge signal.

5. The bit line precharge circuit of claim 1, wherein the first precharge unit includes:
a first MOS transistor configured to be turned ON or OFF depending on the first precharge signal to connect the pair of bit lines to each other; and
second and third MOS transistors configured to be turned ON or OFF depending on the first precharge signal to apply the bit line precharge voltage to the pair of bit lines.

6. The bit line precharge circuit of claim 5, wherein the second precharge unit includes a bleeder MOS transistor configured to be turned ON or OFF in response to the second precharge signal to apply the bit line precharge voltage to the bit line.

7. The bit line precharge circuit of claim 6, wherein the bleeder MOS transistor is configured to have a channel length longer than the first to third MOS transistors.

* * * * *